(12) United States Patent
Lee

(10) Patent No.: US 7,616,486 B2
(45) Date of Patent: Nov. 10, 2009

(54) CELL ARRAY OF SEMICONDUCTOR MEMORY DEVICE AND METHOD OF DRIVING THE SAME

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 51 days.

(21) Appl. No.: 11/965,974

(22) Filed: Dec. 28, 2007

(65) Prior Publication Data
US 2008/0239810 A1  Oct. 2, 2008

(30) Foreign Application Priority Data
Mar. 29, 2007 (KR) .................. 10-2007-0030727

(51) Int. Cl.
*G11C 11/34* (2006.01)
(52) U.S. Cl. .................... 365/185.11; 365/226
(58) Field of Classification Search ............ 365/185.11, 365/226
See application file for complete search history.

(56) References Cited

U.S. PATENT DOCUMENTS

| 5,764,572 | A | * | 6/1998 | Hammick | ............... | 365/189.15 |
| 5,777,923 | A | * | 7/1998 | Lee et al. | ............... | 365/185.11 |
| 5,818,764 | A | * | 10/1998 | Yiu et al. | ............... | 365/185.11 |
| 6,381,670 | B1 | * | 4/2002 | Lee et al. | ............... | 711/103 |
| 6,873,561 | B2 | * | 3/2005 | Ooishi | ............... | 365/226 |

FOREIGN PATENT DOCUMENTS

| JP | 2002-251885 | 9/2002 |
| JP | 2003-016792 | 1/2003 |
| KR | 1020050101685 A | 10/2005 |
| KR | 1020060075361 A | 7/2006 |

* cited by examiner

*Primary Examiner*—Michael T Tran
(74) *Attorney, Agent, or Firm*—Townsend and Townsend and Crew LLP

(57) ABSTRACT

A cell array of a flash memory device includes first and second memory block units, and a voltage generator. Each of the first and second memory block units includes a plurality of memory blocks having a plurality of memory cells. The voltage generator outputs a source voltage, a power supply voltage and a positive bias to the first and second memory block units. The first and second memory block units are connected in parallel through a bit line.

16 Claims, 2 Drawing Sheets

CELL ARRAY OF SEMICONDUCTOR MEMORY DEVICE AND METHOD OF DRIVING THE SAME

CROSS-REFERENCES TO RELATED APPLICATIONS

The present application claims priority to Korean patent application number 10-2007-030727, filed on Mar. 29, 2007, which is incorporated by reference in its entirety.

BACKGROUND OF THE INVENTION

The present invention relates to semiconductor memory devices and, more particularly, to a cell array of a semiconductor memory device and a method of driving the same, in which the leakage current can be reduced.

A flash memory device of a semiconductor memory device generally enables writing, reading and electrical erasure of information, and includes a plurality of memory cell arrays arranged in row and column directions.

The flash semiconductor memory cells are arranged in row and column directions to form a memory cell array. The flash semiconductor memory cell has a drain connected to a bit line extending in a column direction and a control gate connected to a word line extending in a row direction.

FIG. 1 is a circuit diagram of a cell array of a conventional semiconductor memory device.

Referring to FIG. 1, a memory cell array 10 includes a plurality of memory blocks 11; a block 0 to a block n (each including a plurality of memory cells, a source select transistor, and a drain select transistor) and a source voltage generator 12 for applying a source voltage to a common source line CSL that connects block 0 to block n of the memory block 11.

In the same sub of the memory cell array 10, block 0 to block n of the memory block 11 are connected to bit lines in parallel, and the source lines of block 0 to block n are connected to a common source line CSL.

In the cell array of the semiconductor memory device, a positive bias of about 1V is applied to a selected bit line and 0V is applied to the common source line CSL during the read operation. Also, when a selected cell is erased, the current flows from the common source line CSL to the bit line.

In the cell array of the conventional semiconductor memory device constructed above, if the number of memory blocks connected to the same bit line is increased as the capacity of a semiconductor device gradually increases, the amount of the leakage current also increases. As the degree of integration of the device gradually increases, the on-cell current is decreased and the leakage current is increased. Thus, the sensing margin which discriminates between a programmed cell and an erased cell in a selected block abruptly decreases, causing an error in the device.

SUMMARY OF THE INVENTION

Accordingly, the present embodiment relates to a cell array of a semiconductor memory device and a method of driving the same, in which a plurality of memory blocks are divided into N block units, and common source lines connected to every block unit are connected to a source voltage generator through a switching unit, so that at the time of a read operation, the amount of the leakage current discharged through the common source lines is decreased and a sensing margin can be secured.

In an aspect, the present embodiment provides a cell array of the semiconductor memory device including first and second memory block units, and a voltage generator. Each of the first and second memory block units includes a plurality of memory blocks having a plurality of memory cells. The voltage generator outputs a source voltage, a power supply voltage and a positive bias to the first and second memory block units. The first and second memory block units are connected in parallel through a bit line.

In another aspect, the present embodiment provides a cell array of a semiconductor memory device including memory block units and a voltage generator. Each of the memory block units includes a plurality of memory blocks respectively having a plurality of memory cells. The voltage generator outputs a source voltage, a power supply voltage and a positive bias to the memory block units. When a selected one of the memory block units is enabled, the remaining memory block units are disabled. The memory block units are connected in parallel through a bit line.

In still another aspect, the present embodiment provides a method of driving a cell array of a semiconductor memory device including first and second memory block units respectively including a plurality of memory blocks, and a voltage generator for outputting an operating voltage to the first and second memory block units, wherein the first and second memory block units are connected in parallel through a bit line. The method includes the steps of at the time of a program operation, allowing the voltage generator to generate a power supply voltage, applying a power supply voltage to a common source line connected to a selected first memory block unit, wherein a common source line connected to an unselected second memory block unit is applied with the power supply voltage or floated, and performing the program operation of the first memory block unit by applying a program voltage to the bit line.

DESCRIPTION OF SPECIFIC EMBODIMENTS

An embodiment according to the present patent will be described with reference to the accompanying drawings.

Figure 1:
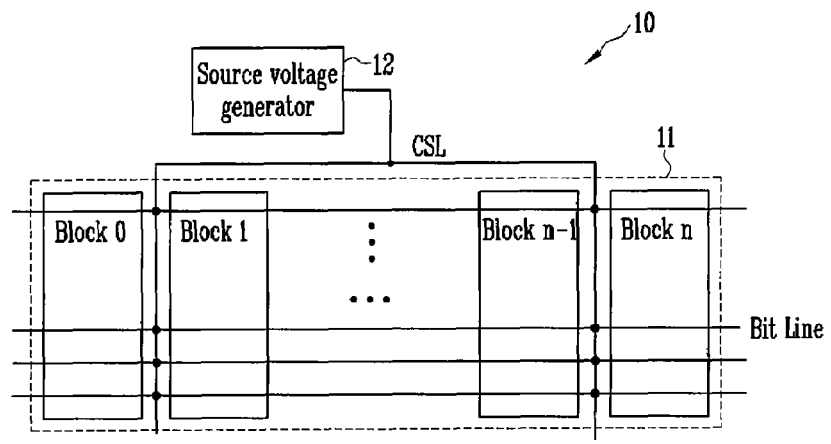
FIG. 1 is a circuit diagram of a cell array of a conventional semiconductor memory device.
Figure 2:
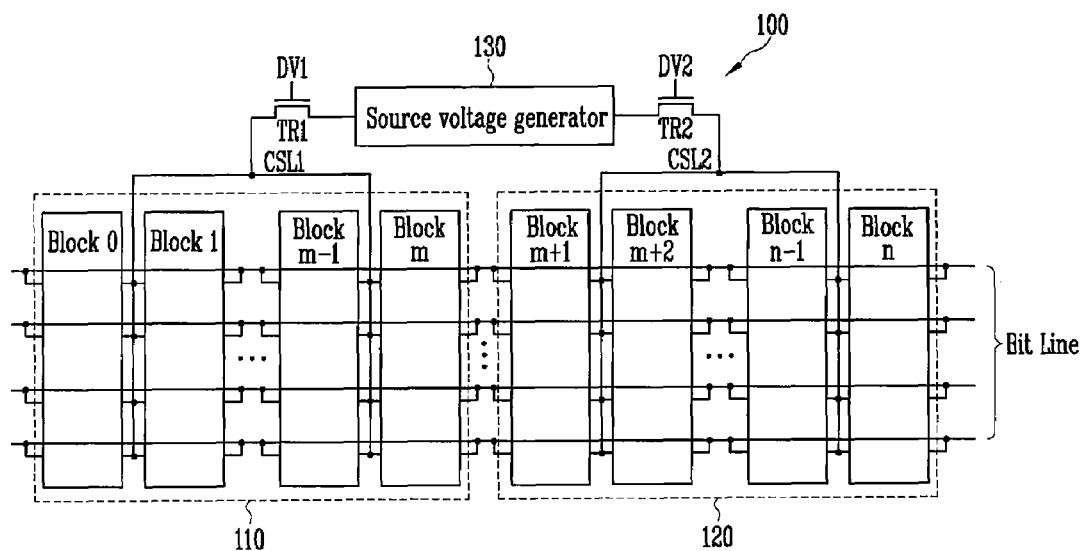
FIG. 2 is a circuit diagram of a cell array of a semiconductor memory device according to an embodiment of the present invention.

Referring to FIG. 2, a memory cell array 100 includes a first memory block unit 110 including a plurality of memory blocks; a block 0 to a block m, a second memory block unit 120 including a plurality of memory blocks; a block m+1 to a block n, first and second common source lines CSL1 and CSL2 respectively connected to the first and second memory blocks 110, 120, a source voltage generator 130 for applying the first and second common source lines CSL1 and CSL2 with a source voltage 0V or a power supply voltage 2 to 4V, and a positive bias, and first and second switching units TR1 and TR2 respectively connected between the source voltage generator 130 and the first and second common source lines CSL1 and CSL2.

In the present embodiment, the plurality of memory blocks; block 0 to block n has been divided into two memory block units. However, the memory blocks can be divided into two or more memory block units. Preferably, the memory blocks provided within the memory block unit are in multiple of 2.

The memory blocks in the first memory block unit 110 and the second memory block unit 120 are connected in parallel to a plurality of bit lines.

The first switching unit TR1 applies the source voltage, output from the source voltage generator 130 to the first common source line CSL1 in response to a first driving signal DV1. The second switching unit TR2 applies the source voltage, output from the voltage generator 130, to the second common source line CSL2 in response to a second driving signal DV2. The first switching unit TR1 and the second switching unit TR2 each may be a switch or transistor, e.g., an NMOS transistor.

Figure 3:
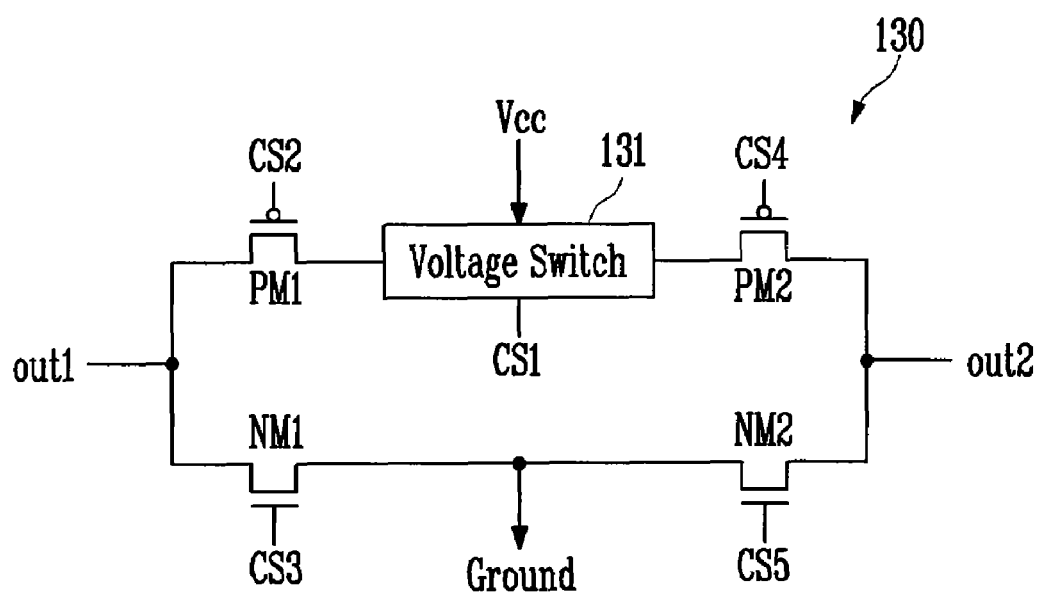
FIG. 3 is an internal circuit diagram of a source voltage generator shown in FIG. 2.

FIG. 3 is an internal circuit diagram of the source voltage generator 130 shown in FIG. 2.

Referring to FIG. 3, the source voltage generator 130 includes a voltage switch 131, PMOS transistors PM1 and PM2, and NMOS transistors NM1, NM2.

The voltage switch 131 is applied with a power supply voltage Vcc, and outputs or blocks the power supply voltage Vcc in response to a first control signal CS1. The PMOS transistor PM1 is connected between an output node of the voltage switch 131 and a first output node out1 of the source voltage generator 130 and is driven in response to a second control signal CS2. The NMOS transistor NM1 is connected between the ground and the first output node out1 and is driven in response to a third control signal CS3. The PMOS transistor PM2 is connected between the output node of the voltage switch 131 and a second output node out2 of the source voltage generator 130 and is driven in response to a fourth control signal CS4. The NMOS transistor NM2 is connected between the ground and the second output node out2 and is driven in response to a fifth control signal CS5.

The levels of the first to fifth control signals CS1 to CS5 selected at the time of program and read operations are listed in the following table.

TABLE 1

|  | CS1 | CS2/CS4 | CS3/CS5 |
|---|---|---|---|
| Program operation | Off | High | Low |
| Read operation | Off | High | High |

An operation of the cell array of the semiconductor memory device according to an embodiment of the present invention is described below with reference to FIGS. 2 and 3.

At the time of the read operation, in the source voltage generator 130, the voltage switch 131 is disabled in response to the first control signal CS1, and outputs a source voltage 0V in response to the third control signal CS3. In this case, the read operation of a selected memory block unit (e.g., the first memory block unit 110) is performed. An enabled first driving signal DV1 is applied to the first switching unit TR1, so that the source voltage 0V output from the voltage generator 130 is applied to the first common source line CSL1. The source lines of the plurality of memory blocks, i.e., blocks 0 to block m of the first memory block unit 110, are applied with 0V. At this time, the word line (not shown) of the memory blocks, i.e., block 0 to block m, is applied with a read voltage, so that data programmed according to the state of a selected memory cell is read through a selected bit line.

At the same time, the unselected second memory block unit 120 is not applied with the source voltage 0V because of a disabled second driving signal DV2 is applied to the switch TR2. Thus, the second common source line CSL2 becomes a floating state, and the read operation is not performed since the source line becomes a floating state even if the word lines of the plurality of memory blocks, i.e., the block m+1 to the block n are applied with a read voltage.

In other words, the read operation is performed only on the selected first memory block unit 310. Due to this, in the case where a selected cell is erased, the amount of current flow in the bit line is decreased. Thus, a program disturb phenomenon can be reduced because the ratio of current flow between a program cell and an erase cell can be maintained although the on-cell current is decreased.

The source voltage generator 130 generates the source voltage 0V and also a positive bias, and can apply the positive bias to the second common source line CSL2 of the unselected memory block unit 320. The first common source line CSL1 connected to the first memory block unit 110 is applied with the source voltage 0V, and the second common source line CSL2 connected to the unselected memory block unit 120 is applied with the positive bias.

The levels of the first to fifth control signals CS1 to CS5 applied to the source voltage generator 130 are listed in the following table.

TABLE 2

|  | Selected block | | Unselected block | |
|---|---|---|---|---|
| CS1 | CS2 | CS3 | CS4 | CS5 |
| On | High | High | Low | Low |

In this case, the first and second switching units TR1 and TR2 apply the source voltage 0V and the positive bias to the first and second common source lines CSL1 and CSL2, respectively, in response to the enabled first driving signal DV1 and the second driving signal DV2, respectively.

Table 3 illustrates potential states depending on the operation of the device of the first and second common source lines according to an embodiment of the present invention.

TABLE 3

| Operating State | Select Block | Unselect Block |
|---|---|---|
| Read operation | Source voltage | Positive or Floating |
| Program operation | Power supply voltage | Power supply voltage or Floating |
| Erase operation | Floating | Floating |

At the time of a program operation, the first common source line CSL1 of the selected first memory block unit 110 is precharged to a power supply voltage Vdd output from the source voltage generator 130. In this case, the second common source line CSL2 of the unselected second memory block unit 120 can be floated, or applied with the power supply voltage Vdd or a down-converted voltage lower than the power supply voltage Vdd by using the second switching unit TR2. Due to this, only the first common source line CSL1 is precharged, so that the speed of the program operation can be improved.

At the time of an erase operation, both the selected first memory block unit 110 and the unselected second memory block unit 120 are floated.

In the above embodiment, it has been described that the first memory block unit 110 is a selected block unit. However, if the second memory block unit 120 is selected, the first memory block unit 110 becomes an unselected memory block unit. In this state, the read, program and erase operations can be performed.

As described above, according to the present invention, a plurality of memory blocks are disposed into N block units, and common source lines connected to the block units are connected to a source voltage generator through a switching unit, so that at the time of a read operation, the leakage current discharged through the common source lines is decreased and sensing margin can be secured.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A cell array of a semiconductor memory device, the cell array comprising:
   first and second memory block units respectively including a plurality of memory blocks having a plurality of memory cells; and
   a voltage generator configured to output a source voltage, a power supply voltage, and a positive bias to the first and second memory block units,
   wherein the source voltage is applied to source lines of a selected memory block unit and the positive bias is applied to source lines of an unselected memory block unit during a read operation.

2. The cell array of claim 1, further comprising:
   a first common source line connected to source lines of the memory blocks of the first memory block unit;
   a second common source line connected to source lines of the memory blocks of the second memory block unit; and
   a switch system configured to connect the voltage generator to the first common source line when a first enable signal is received and to connect the voltage generator to the second common source line when a second enable signal is received.

3. The cell array of claim 2, wherein the switch system includes:
   a first switching unit provided between the voltage generator and the first common source line; and
   a second switching unit provided between the voltage generator and the second common source line.

4. The cell array of claim 1, wherein at the time of read and program operations, only one of the first and second memory block units is enabled.

5. The cell array of claim 3, wherein at the time of a read operation, a selected one of the first and second switching units is enabled, so that the source voltage output from the voltage generator is applied to a selected one of the first and second common source lines, and an unselected one of the first and second switching units is disabled, so that an unselected common source line is floated.

6. The cell array of claim 5, wherein the source voltage is 0V.

7. The cell array of claim 3, wherein at the time of a read operation, a selected one of the first and second switching units is enabled, so that the source voltage output from the voltage generator is applied to a selected one of the first and second common source lines, and an unselected one of the first and second switching units is enabled, so that the positive bias is applied to an unselected common source line.

8. The cell array of claim 7, wherein the power supply voltage is in the range of 2 to 4V.

9. The cell array of claim 3, wherein at the time of a program operation, a selected one of the first and second switching units is enabled, so that the power supply voltage output from the voltage generator is applied to selected one of the first and second common source lines, and an unselected one of the first and second switching units is disabled, so that an unselected common source line is floated.

10. The cell array of claim 3, wherein at the time of an erase operation, both the first common source line and the second common source line are floated.

11. The cell array of claim 3, wherein the first switching unit includes a transistor for applying the output of the voltage generator to the first common source line in response to a driving signal.

12. The cell array of claim 3, wherein the second switching unit includes a transistor for applying the output of the voltage generator to the second common source line in response to a driving signal.

13. A semiconductor memory device comprising:
   first and second memory block units each having a plurality of memory cells;
   a voltage generator for outputting a source voltage, a power supply voltage and a positive bias to the memory block units; and
   a switch system comprising a first switch and a second switch, the first switch being configured to connect the first memory block unit and the voltage generator in response to receiving a first enable signal, the second switch being configured to connect the second memory block unit and the voltage generator in response to receiving a second enable signal,
   wherein the source voltage is applied to source lines of a selected memory block unit, and a positive bias is applied to source lines of an unselected memory block unit during a read operation,
   wherein the power supply voltage is applied to the source lines of the selected memory block unit, and the source lines of the unselected memory block unit are floated during a program operation.

14. A method of driving a cell array of a semiconductor memory device including first and second memory block units each including a plurality of memory blocks, and a voltage generator for outputting operating voltages to the first and second memory block units, the method comprising:
   allowing the voltage generator to generate a first voltage during a program operation;
   applying the first voltage to a first common source line connected to a selected first memory block unit;
   applying a second voltage to a second common source line connected to an unselected second memory block unit; and
   applying a third voltage to a bit line to perform the program operation on the first memory block unit,
   wherein the execution of the program operation on the second memory block unit is stopped while the first memory block unit is being programmed, and
   wherein the bit line is connected to the memory blocks of the first memory block unit and the memory blocks of the second memory block unit.

15. The method of claim 14, further comprising:
   allowing the voltage generator to generate a source voltage and a positive bias during a read operation;
   applying the source voltage to the first common source line connected to the selected first memory block unit;
   applying the positive bias or floating the second common source line connected to the unselected second memory block unit; and
   performing the read operation of the first memory block unit by applying a read voltage to the bit line,
   wherein the second memory block unit is prevented from performing the read operation.

16. The method of claim 14, further comprising:
   floating the first and second common source lines connected to the first memory block unit and the second memory block unit, respectively; and
   performing an erase operation on the first and second memory block units by applying the read voltage to the bit line.

* * * * *